(12) United States Patent
Shih

(10) Patent No.: US 7,258,568 B2
(45) Date of Patent: Aug. 21, 2007

(54) SLIDING MODULE POSITIONING DEVICE

(75) Inventor: You-Lin Shih, Taipei Hsien (TW)

(73) Assignee: Aten International Co., Ltd., Taipei Hsien (TW)

( * ) Notice: Subject to any disclaimer, the term of this patent is extended or adjusted under 35 U.S.C. 154(b) by 0 days.

(21) Appl. No.: 11/453,806

(22) Filed: Jun. 16, 2006

(65) Prior Publication Data

US 2006/0289370 A1    Dec. 28, 2006

(30) Foreign Application Priority Data

Jun. 24, 2005    (TW) .............................. 94121279 A

(51) Int. Cl.
*H01R 13/64* (2006.01)
*H05K 7/16* (2006.01)
*G06F 1/16* (2006.01)

(52) U.S. Cl. .................... 439/377; 361/683; 211/26

(58) Field of Classification Search ............... 439/377; 361/683; 211/26
See application file for complete search history.

(56) References Cited

U.S. PATENT DOCUMENTS 6,807,054 B1 * 10/2004 Waller et al. ............... 361/683
6,945,412 B2 * 9/2005 Felcman et al. ............. 211/26
7,019,963 B2 * 3/2006 Lee et al. .................... 361/683
7,187,554 B2 * 3/2007 Seki et al. ................... 361/727
2006/0232917 A1 * 10/2006 Wu et al. .................... 361/681

* cited by examiner

*Primary Examiner*—Xuong Chung-Trans
(74) *Attorney, Agent, or Firm*—Birch, Stewart, Kolasch & Birch, LLP

(57) ABSTRACT

A sliding module positioning device for locking a sliding module at a predetermined position on a rack is described. The sliding module positioning device includes a base, a positioning pin, an elastic device, an internal pushing member, and an external control member. The positioning pin is moveable on the base and coupled to the elastic device for pushing the positioning pin into a positioning hole on a positioning bracket. The internal pushing member can push the positioning pin away from the positioning hole. The external control member connects with the internal pushing member, and the positioning pin couples to an inner surface of the internal pushing member to prevent the positioning pin protruding from the external control member after the positioning pin is moved away from the positioning hole. The positioning device further utilizes an elastic piece for coupling the positioning pin to the positioning hole.

20 Claims, 5 Drawing Sheets

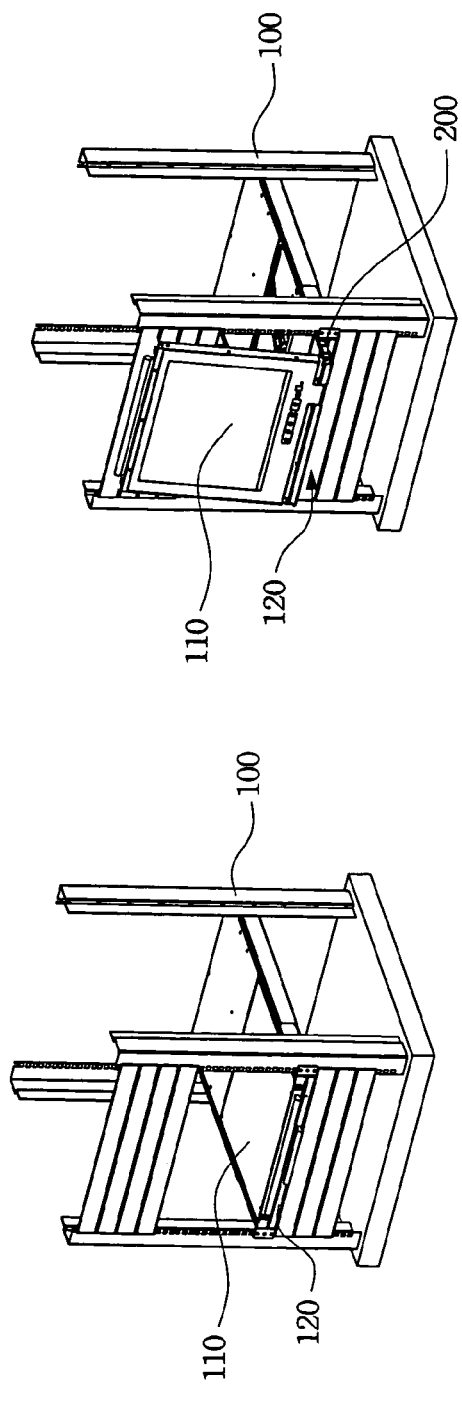
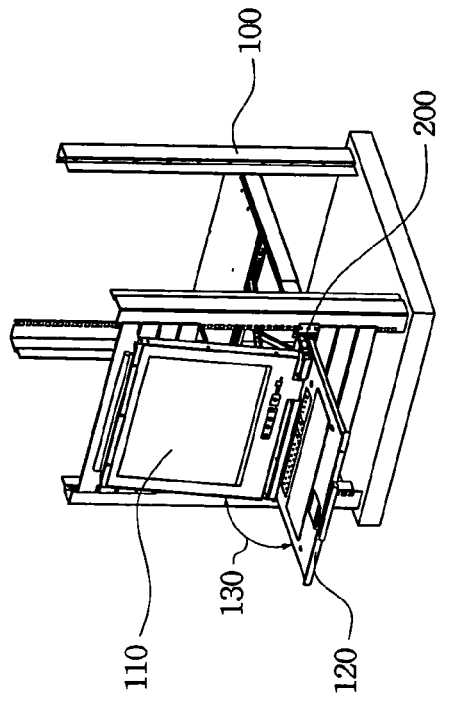
Fig. 1A
Fig. 1C
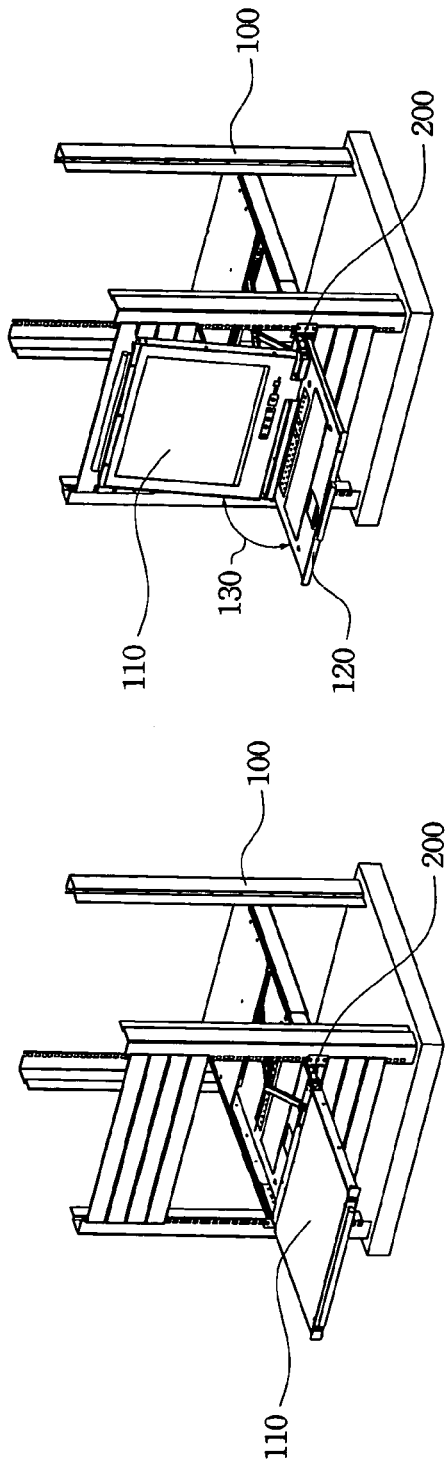
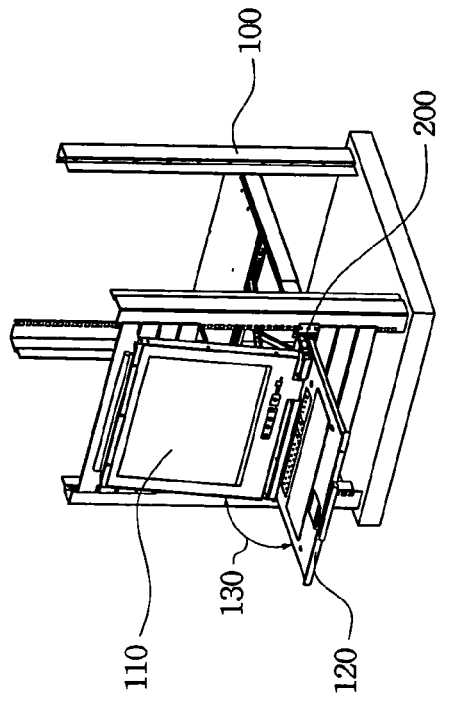
Fig. 1B
Fig. 1D

SLIDING MODULE POSITIONING DEVICE

RELATED APPLICATIONS

The present application is based on, and claims priority from, Taiwan Application Serial Number 94121279, filed on Jun. 24, 2005, the disclosure of which is hereby incorporated by reference herein in its entirety.

FIELD OF THE INVENTION

The present invention generally relates to a positioning device of a sliding module. More particularly, this invention relates to a positioning device of a sliding module for a server rack.

BACKGROUND OF THE INVENTION

Information technology and the computer industry are highly developed. People rely heavily on computer systems. Therefore, computer servers with high calculation capacity and high stability are becoming increasingly important. Due to increasingly reduced office space, the area occupied by computer servers must also be reduced. Computer servers must have a high degree of stability to serve users, and the space occupied by one computer server is therefore greater than or equal to that of a desktop computer. Accordingly, the management of computer servers is difficult and space utilization is tightened. Some companies have two or three computer servers, while others may have more than a thousand computer servers. Computer server management and space utilization is becoming more critical in companies that use many computer servers.

A 1U computer server assembled on a standard 1U server rack is the mainstream computer server arrangement. Each standard layer of the server rack is about 1.75 inches (about 4.5 centimeters), so that the 1U server and the server rack effectively conserve the space occupied by the computer servers. Moreover, the 1U servers and racks are more efficiently controlled because the 1U servers and racks can be centrally managed and easily stacked. Normally, hardware components used in the 1U server are smaller in size and lower in height to meet the 1.75 inch thickness limitation.

To conveniently control the stacked 1U computer servers on the server rack, KVM (keyboard-video-mouse) switches are used to connect and control the computer servers. Hence, the quantity of the displays and keyboards for controlling the computer servers can be effectively reduced and the occupied space thereof is also reduced.

However, due to the height constraints on the 1U server rack, the dimensions of the keyboard and the display have to fulfill the dimension limitations to operate on the server rack. Therefore, various sliding keyboard and display modules are designed to operate on the 1U server rack. The sliding keyboard and display modules have to be securely positioned on the server rack to avoid being dislodged by unexpected external forces or vibrations that would influence normal operations, damage the equipment, or hurt the users.

SUMMARY OF THE INVENTION

It is an objective of the present invention to provide a sliding module positioning device for safely locking a sliding module at a predetermined position on a server rack so as to improve the operational safety thereof.

To accomplish the above objectives, the present invention provides a sliding module positioning device that includes a base, a positioning pin, an elastic device, an internal pushing member, and an external control member. The positioning pin is located on and can be moved along the base. The elastic device is coupled to the positioning pin to push the positioning pin into a positioning hole in a predetermined direction. The internal pushing member can move the positioning pin away from the positioning hole in the opposite direction and the positioning pin then couples to the inner surface of the external control member to prevent the positioning pin from protruding out of the external control member.

The positioning pin further includes a fixed corner and a retracting bracket. The fixed corner is secured to the positioning pin and coupled to the elastic device to push the positioning pin toward the positioning hole. The retracting bracket is secured to the fixed corner and forms a predetermined angle with the predetermined direction of the positioning pin. In addition, the internal pushing member pushes the retracting bracket to move the positioning pin in the opposite direction to the predetermined direction. The positioning hole is preferably configured on a positioning bracket of a rail module and the positioning bracket preferably includes an elastic piece. The elastic piece can move the external control member to allow the positioning pin to protrude from the external control member and couple to the positioning hole when the external control member is drawn out and the elastic piece is in contact with the external control member. For example, the positioning pin may pass through an opening on the external control member, protrude from the external control member and couple with the positioning hole.

The sliding module positioning device is preferably fixed on a supporting bracket of the sliding module and the supporting bracket is preferably coupled to a slide on the sliding module.

Another aspect of the present invention is to provide a sliding module that includes a rail, a slide, and the foregoing sliding module positioning device. The sliding module positioning device is preferably coupled to the slide for sliding on a 1U server rack along the rail.

Yet another aspect of the present invention is to provide a sliding flat panel display and keyboard module that includes an L-shaped supporting frame, a vertical sliding rail, a horizontal sliding rail, a sliding flat panel display module, a sliding keyboard module, and the foregoing sliding module positioning device. The vertical sliding rail is configured on a vertical plane of the L-shaped supporting frame and the horizontal sliding rail is configured on a horizontal plane of the L-shaped supporting frame. The sliding flat panel display module is coupled to the vertical sliding rail and moves along the L-shaped supporting frame horizontally. The sliding keyboard module is coupled to the horizontal sliding rail to move along the L-shaped supporting frame horizontally. The sliding module positioning device is preferably coupled to a supporting bracket of the sliding flat panel display module and the supporting bracket is movable on the vertical sliding rail. The L-shaped supporting frame is fixed on a 1U server rack and the width of the horizontal sliding rail is greater than a thickness of the sliding keyboard module.

Hence, the sliding module positioning device can provide a safe and stable positioning device for a sliding module on a server rack and users can operate the sliding module positioning device from outside thereof so as to provide a reliable and safe environment for operating the sliding module and especially when the sliding module is pulled out and pushed back into the rack.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIGS. 1A to 1D illustrate a preferred embodiment of the sliding module positioning device according to the present invention;

DETAILED DESCRIPTION OF THE PREFERRED EMBODIMENT

Figure 2:
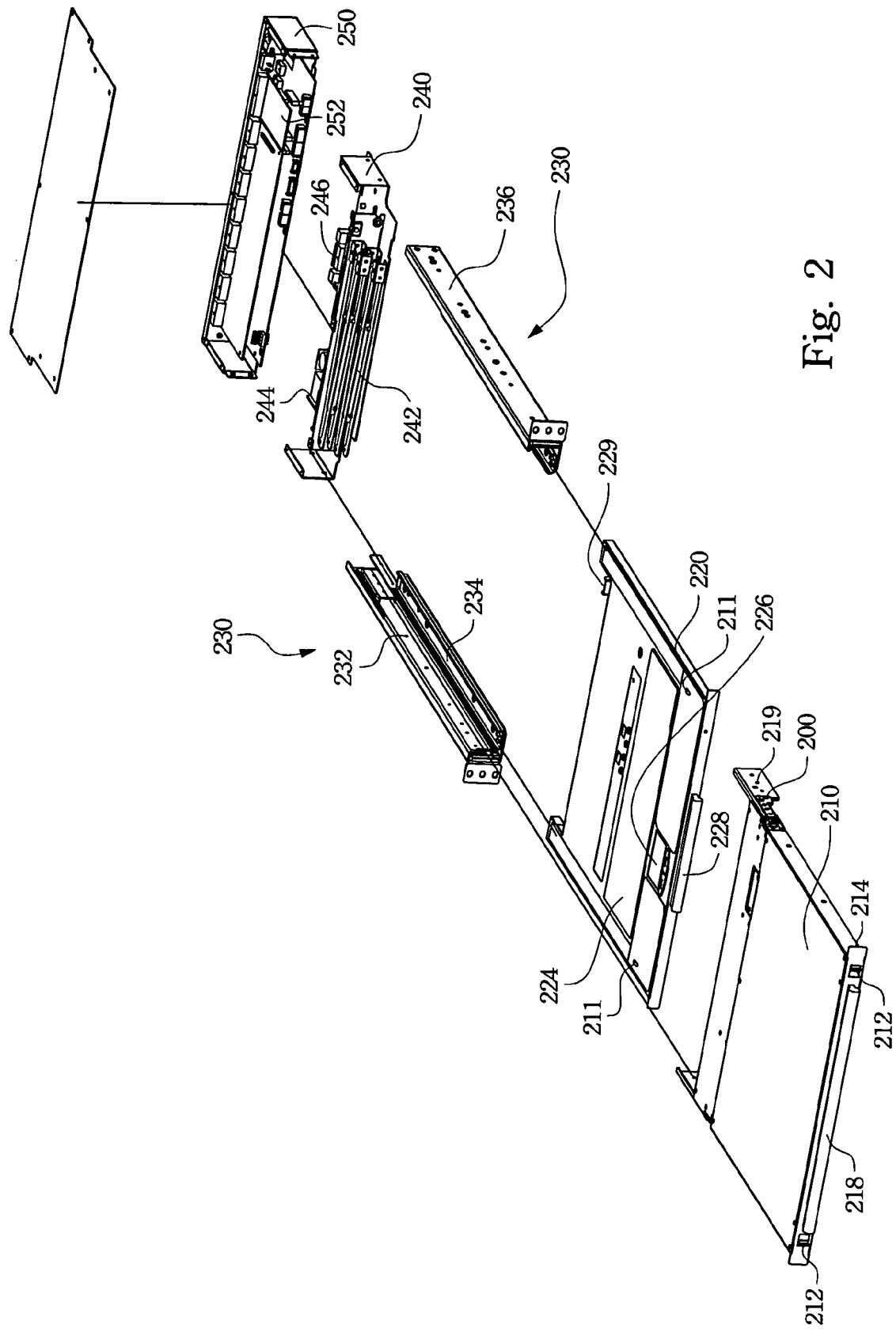
FIG. 2 is an exploded view of the preferred embodiment of FIGS. 1A to 1D.

The following description is currently the best implementation of the present invention. This description is not to be taken in a limiting sense but is made merely to describe the general principles of the invention. The scope of the invention should be determined by referencing the appended claims.

FIGS. 1A to 1D illustrate a preferred embodiment of the sliding module positioning device according to the present invention. The sliding module positioning device according to the present invention is preferably configured on a sliding module, for example, a sliding flat panel display module 110, on a server rack 100. In the preferred embodiment, a sliding keyboard module 120 is disposed under the sliding flat panel display module 110. Both the sliding flat panel display module 110 and the sliding keyboard module 120 can slide on the server rack 100. Therefore, the sliding module positioning device 200 can be configured on the sliding flat panel display module 110 and/or on the sliding keyboard module 120 to allow the sliding flat panel display module 110 and/or the sliding keyboard module 120 to be secured in predetermined positions.

FIG. 1A illustrates the sliding flat panel display module 110 and the sliding keyboard module 120 retracted in the server rack 100. FIG. 1B illustrates the sliding flat panel display module 110 drawn out from the server rack 100. FIG. 1C illustrates the sliding flat panel display module 110 drawn out alone and opened upwardly. FIG. 1D illustrates the sliding flat panel display module 110 and the sliding keyboard module 120 drawn out simultaneously. An open angle 130 of the sliding flat panel display module 110 is preferably greater than 90 degrees, and more preferably about 95-97 degrees. This makes it easier for users to see the flat panel display. Furthermore, the sliding flat panel display module 110 can also avoid reducing the open angle 130 to less than 90 degrees, sometimes caused by the sliding flat panel display module 110 interfering with a device handle disposed above the sliding flat panel display module 110. A smaller open angle may influence the users to operate the computer.

FIG. 2 is an exploded view of the preferred embodiment of FIGS. 1A to 1D to illustrate the detailed configuration of the sliding module positioning device according to the present invention. Referring to FIG. 2, the sliding module positioning device 200 is disposed on a supporting bracket 219 at the rear side of the sliding flat panel display module 210. A sliding keyboard module 220 is disposed under the sliding flat panel display module 210 and both of them adopt the same rail module 230. The rail module 230 is composed of an L-shaped supporting frame 236, a first rail 232, and a second rail 234. The first rail 232 is preferably a vertical sliding rail, and the second rail 234 is preferably a horizontal sliding rail 234 perpendicular to the first rail 232. The L-shaped supporting frame 236 is a rigid supporting frame coupled with the server rack and supporting the vertical sliding rail 232 and the horizontal sliding rail 234 thereon. The vertical sliding rail 232 is fixed on a vertical plane of the L-shaped supporting frame 236 and the horizontal sliding rail 234 is fixed on a horizontal plane of the L-shaped supporting frame 236.

The sliding flat panel display module 210 couples to the vertical sliding rail 232 of the rail module 230 to allow the sliding flat panel display module 210 to slide horizontally along the rail module 230. The sliding flat panel display module 210 is thus allowed to be retracted or drawn out on the rail module 230. The sliding keyboard module 220 couples to the horizontal sliding rail 234 of the rail module 230 to allow the sliding keyboard module 220 to slide horizontally along the rail module 230, thus enabling the sliding keyboard module 220 to be retracted or drawn out on the rail module 230.

The sliding flat panel display module 210 and the sliding keyboard module 220 are independently coupled to respective vertical sliding rail 232 and horizontal sliding rail 234 so that the user may draw out the sliding flat panel display module 210 alone to monitor the server computers or simultaneously draw out the sliding keyboard module 220 to control the server computers on demand. That is to say, the sliding keyboard module 220 can be drawn out from the rail module 230, from the server rack, to control the server computers with keys 224 and touch pad 226 on the sliding keyboard module 220 according to need.

The sliding flat panel display module 210 can be drawn out from the server rack alone and then opened upwards (referring to FIG. 1C) to monitor the server computers. At this moment, the sliding keyboard module 220 need not be drawn out from the server rack. Therefore, the working path for users in a computer center can be wider without the drawn out sliding keyboard module 220 blocking the path. The sliding keyboard module 220 has to be drawn out from the server rack only when the user has to operate the server computers, thereby smoothing the working path in the computer center, and allowing users greater convenience when moving around to check the server computers.

Furthermore, the horizontal sliding rail 234 can effectively increase the operating stability of the sliding keyboard module 220. The sliding keyboard module 220 adopts the horizontal sliding rail 234 to slide horizontally on the server rack so that the width of the horizontal sliding rail 234 is independent of the thickness of the sliding keyboard module 220. The width of the horizontal sliding rail 234 can be larger than the thickness of the sliding keyboard module 220 to further increase the supporting strength of the sliding keyboard module 220 while the total thickness of the sliding keyboard module 220 remains not influenced. Hence, the horizontal sliding rail 234 can effectively support the sliding keyboard module 220 for stable operation of the sliding keyboard module 220 thereon. Therefore, the horizontal sliding rail 234 can further decrease the thickness of the sliding keyboard module 220, thereby improving the space utilization in the server racks.

The vertical sliding rail 232 of the sliding flat panel display module 210 further utilizes a short internal slide to increase a sliding stroke for the sliding flat panel display module 210. In conjunction with a supporting bracket 219 of the sliding flat panel display module 210, the predetermined stroke can allow the open angle 130 (referring to FIG. 1D) of the sliding flat panel display module 210 to be greater than 90 degrees, thereby conveniently monitoring the server computers with the sliding flat panel display module 210 on the server racks for the users. In particular, the sliding flat panel display module 210 can allow an open angle larger than 90 degrees, even when a protruding handle 218 is disposed above the sliding flat panel display module 210. The open angle less than 90 degrees induces the sliding flat panel display module 210 to face a little bit downward so as to disturb users to watch the sliding flat panel display module 210.

On the front portion of the sliding keyboard module 220, a handle 228 is fixed thereon for conveniently drawing out the sliding keyboard module 220. In addition, a linking plate 229 is disposed on the rear portion of the sliding keyboard module 220 to enable the sliding flat panel display module 210 to link with the sliding keyboard module 220. Therefore, the sliding flat panel display module 210 can be drawn out simultaneously with the sliding keyboard module 220 when the user draws out the sliding keyboard module 220. Generally speaking, the sliding keyboard module 220 has to operate together with the sliding flat panel display module 210 for controlling and monitoring the server computers. Accordingly, the linking plate 229 enables the sliding flat panel display module 210 to link with the sliding keyboard module 220 and makes controlling and monitoring the server computers convenient. The sliding keyboard module 220 further includes rollers 211 configured on the surface thereof to maintain a distance with the sliding flat panel display module 210 so that the sliding flat panel display module 210 can be smoothly drawn out from the rail module 230. The rollers 211 can be configured on the surface of the sliding flat panel display module 210, the surface of the sliding keyboard module 220, or both the surfaces of the sliding flat panel display module 210 and the sliding keyboard module 220.

Figure 3:
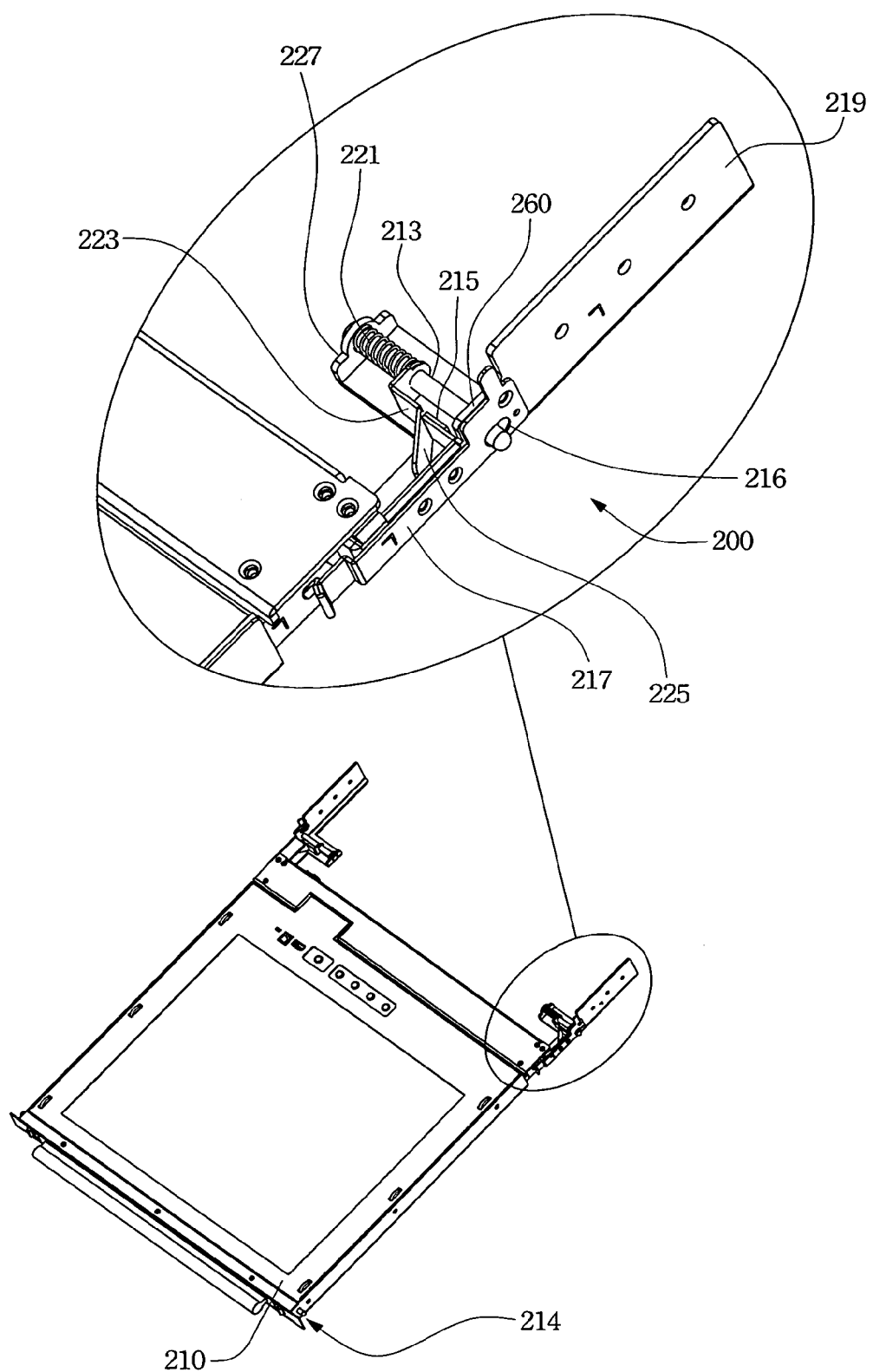
FIG. 3 is a detailed and enlarged view of the sliding module positioning device according to the present invention.
Figure 4A:
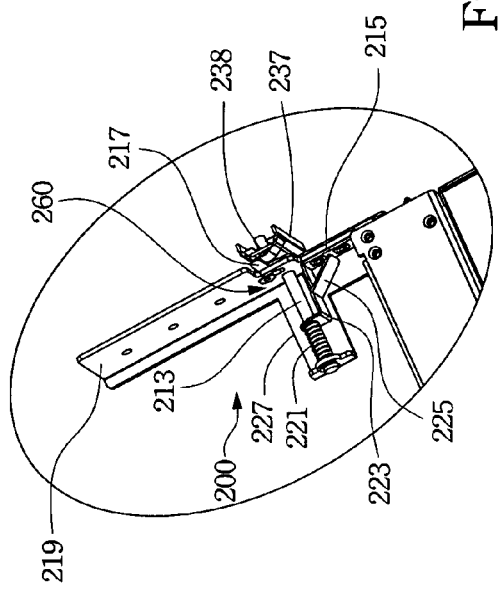
FIG. 4A to 4D illustrate the operational views of the sliding module positioning device according to the present invention.
Figure 4B:
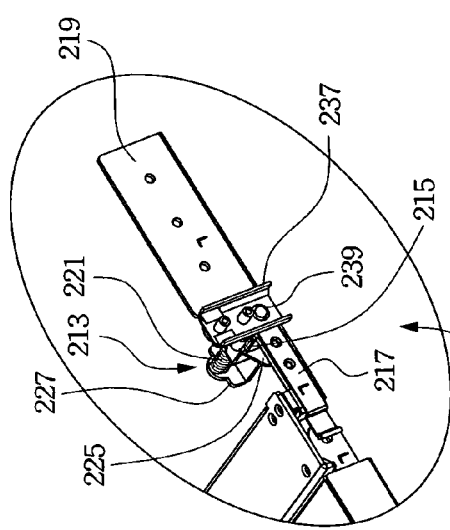
Figure 4C:
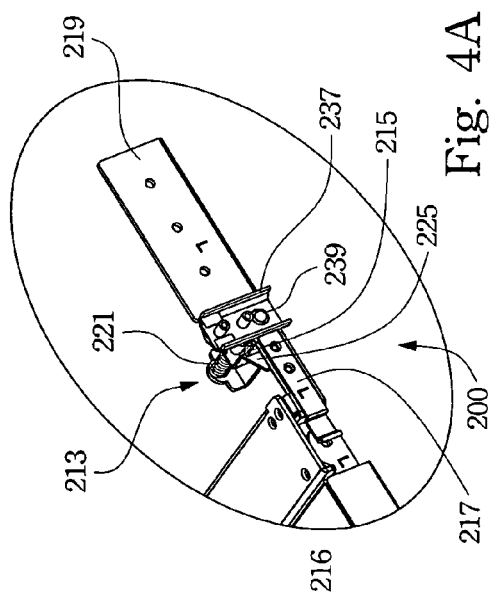
Figure 4D:
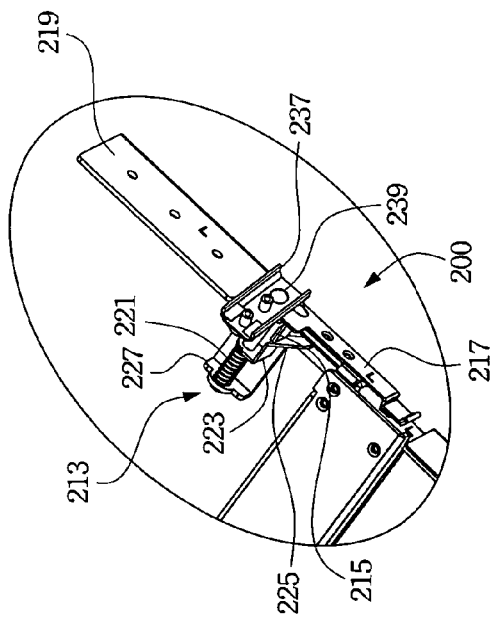

The sliding flat panel display module 210 further includes a handle 218 disposed on the front portion thereof, allowing a user to conveniently draw out the sliding flat panel display module 210. Referring to FIG. 2 and FIG. 4, both sides of the handle 218 include positioning switches 212. The positioning switch 212 utilizes positioning pins 214 (also referring to FIG. 3) disposed on both sides of the sliding flat panel display module 210 to couple to positioning holes 239 of the positioning bracket 237 on the rail module 230, thereby effectively fixing the sliding flat panel display module 210 in the rail module 230 to avoid any unexpected withdrawal or motion when the sliding flat panel display module 210 is stored in the rail module 230.

FIG. 3 and FIGS. 4A to 4D illustrate a detailed and enlarged view of the sliding module positioning device according to the present invention and the operational views thereof. A sliding module positioning device 200 is disposed on the supporting bracket 219 configured on the rear portion of the sliding flat panel display module 210. The sliding module positioning device 200 includes an external control member 217, an internal pushing member 215, a positioning pin 213, and a retracting bracket 225. The external control member 217 is moved together with the internal pushing member 215 in synchrony to conveniently operate the sliding module positioning device 200 externally. The retracting bracket 225 is oblique to the directions of motion of the internal pushing member 215 and the positioning pin 213 so that the internal pushing member 215 can easily push the retracting bracket 225 to move the positioning pin 213. In addition, the retracting bracket 225 further utilizes a fixed corner 223 to fix on the positioning pin 213. An elastic device 221 is configured on a lateral of the fixed corner 223 to push the positioning pin 213 toward a supporting bracket opening 260 and an external control member opening 216. The positioning pin 213 is configured on the base 227 and movable thereon. Furthermore, the base 227 is connected to the supporting bracket 219.

When the sliding flat panel display module 210 is drawn out, the positioning pin 213 may pass through the supporting bracket opening 260 of the supporting bracket 219 and the external control member opening 216 of the external control member 217 and couple with the positioning hole 239 of the positioning bracket 237 on the rail module 230 so that the sliding flat panel display module 210 is fixed at a suitable position for operation. Since the positioning pin 213 is inserted into the positioning hole 239, the sliding flat panel display module 210 can avoid any undesired movement when the sliding flat panel display module 210 is turned upwardly. Accordingly, the sliding flat panel display module 210 is stable and exactly fixed on the suitable position while rotating and operating.

Figure 5:
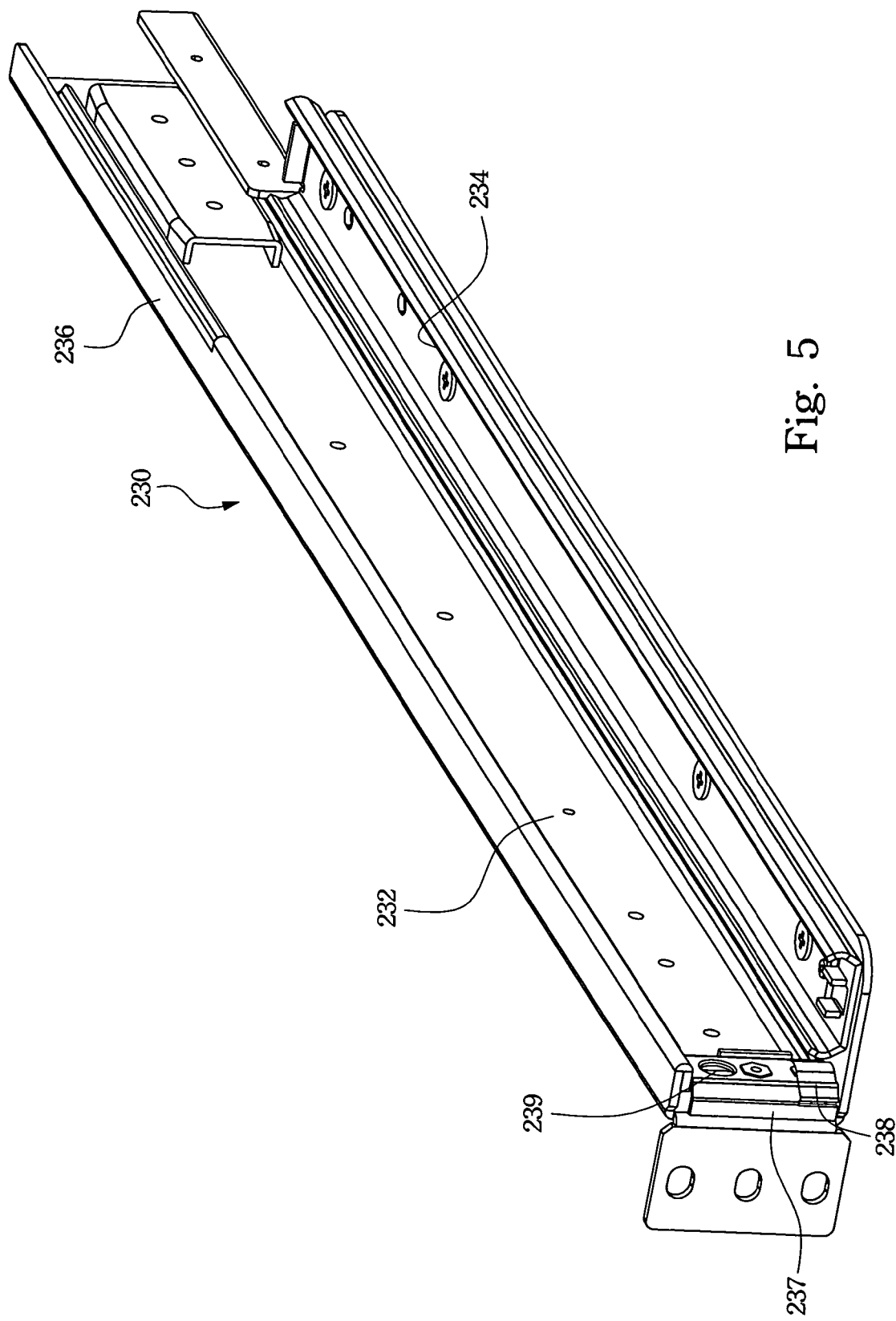
FIG. 5 is a partial view of the rail module.

When users wish to retract the sliding flat panel display module 210, users only need to pull the external control member 217 forwards (toward the front portion of the sliding flat panel display module 210, i.e. toward the user) and the internal pushing member 215 simultaneously moves the retracting bracket 225 to withdraw the positioning pin 213 out of the positioning hole 239 and the external control member opening 216, and preferably withdraw the positioning pin 213 to the inner side of the external control member 217 to prevent the positioning pin 213 protruding from the external control member 217. The positioning pin 213 preferably is in contact with the inner surface of the external control member 217 and the elastic piece 238 (also referring to FIG. 5) securely holds the external control member 217 for misaligning the positioning pin 213 with the external control member opening 216 to effectively prevent the positioning pin 213 protruding from the external control member 217 so that the sliding flat panel display module 210 can be smoothly retracted into the rail module 230, that is, into the server rack 100.

When the sliding flat panel display module 210 is drawn out again, the elastic piece 238 on the positioning bracket 237 of the rail module 230 pushes the external control member 217 backwards to align the external control member opening 216 of the external control member 217, the supporting bracket opening 260 of the supporting bracket 219 and the positioning hole 239 of the positioning bracket 237 again so that the positioning pin 213 can protrude from the external control member 217 to couple to the positioning hole 239 of the positioning bracket 237 again (referring to FIGS. 4C and 4D). The sliding flat panel display module 210 is therefore secured in the foregoing suitable position to provide the sliding flat panel display module 210 with an open angle greater than 90 degrees and thereby users can easily watch the information displayed on the sliding flat panel display module 210.

Furthermore, a control module 240 is configured behind the sliding flat panel display module 210 and the sliding keyboard module 220 to transmit power and signals. The control module 240 further includes cable supporting arms 242, a power supply 244, and a connector 246. The cable supporting arms 242 are able to stretch or shrink for continuously linking with the sliding flat panel display module 210 and the sliding keyboard module 220 when the sliding flat panel display module 210 and the sliding keyboard module 220 are drawn out or retrieved. The power supply 244 provides required power to the sliding flat panel display module 210 and the sliding keyboard module 220, and the connector 246 is coupled to a computer apparatus, such as, for example, a server computer or a KVM (keyboard-video-mouse) switch on the server rack.

Accordingly, the sliding module positioning device of the present invention is suitable for configuration in the server rack, and further provides a safe and reliable environment for controlling the server computers. The sliding module positioning device according to the present invention adopts the external control member to withdraw the positioning pin back to the inner side of the external control member so that the sliding module can smoothly slide on the rail module. When the sliding module reaches the predetermined position, the elastic piece of the positioning bracket on the rail module forces the positioning pin to couple to the positioning hole thereby fixing the sliding module at the suitable position. Since the positioning pin is effectively coupled with the positioning hole and can withstand a force acting on the flat panel display while rotating the flat panel display, the flat panel display can be securely operated by users. When a user want to retract the flat panel display, he only needs to pull the external control member toward himself to release the external control member and then pushes the flat panel display into the server rack. Therefore, the sliding module positioning device according to the present invention can also avoid jamming user's fingers while withdrawing the flat panel display.

In addition, because separated sliding rails perpendicular to each other are utilized to support the sliding flat panel display module and the sliding keyboard module, respectively, thereby enhancing the supporting strength of the sliding flat panel display module and sliding keyboard module. Furthermore, because the thickness of the sliding rail of the sliding keyboard module can be less than the height of a conventional sliding keyboard module, the width of the sliding rail of the sliding flat panel display module can be designed greater than the thickness of the sliding flat panel display module, thereby further increasing the supporting strength of the sliding flat panel display module. In combination with the safe positioning device, the sliding flat panel display module and sliding keyboard module can be operated more safely and stably whenever the sliding flat panel display module and sliding keyboard module are retracted or drawn out.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A sliding module positioning device, comprising:
a base;
a positioning pin configured on the base and moveable on the base;
an elastic device coupled to the positioning pin to push the positioning pin toward a positioning hole along a predetermined direction;
an internal pushing member for moving the positioning pin away from the positioning hole; and
an external control member connected with the internal pushing member, wherein the positioning pin is coupled on an inner surface of the external control member to prevent the positioning pin protruding from the external control member when the positioning pin is moved away from the positioning hole.

2. The sliding module positioning device of claim 1, further comprising a fixed corner fixed to the positioning pin and coupled to the elastic device to push the positioning pin toward the positioning hole.

3. The sliding module positioning device of claim 2, further comprising a retracting bracket fixed to the fixed corner and formed a predetermined angle with the predetermined direction of the positioning pin, and the internal pushing member pushes the retracting bracket to move the positioning pin away from the positioning hole.

4. The sliding module positioning device of claim 1, wherein the positioning hole is configured on a positioning bracket of a rail module.

5. The sliding module positioning device of claim 4, wherein the positioning bracket further comprises an elastic piece, wherein the elastic piece moves the external control member to allow the positioning pin to protrude from the external control member and couple to the positioning hole when the elastic piece is in contact with the external control member and the external control member is drawn out by the elastic piece, and the elastic piece holds the external control member to allow the positioning pin to be in contact with the inner surface of the external control member when the positioning pin is moved away from the positioning hole and drawn back to an inner side of the external control member thereby allowing the sliding module positioning device to be drawn back.

6. The sliding module positioning device of claim 5, wherein the external control member further comprises an opening to allow the positioning pin to pass through and couple with the positioning hole.

7. The sliding module positioning device of claim 1, wherein the base is fixed on a supporting bracket of a sliding module.

8. The sliding module positioning device of claim 7, wherein the supporting bracket is coupled to a slide on a rail module and the positioning hole is disposed on a positioning bracket of the rail module.

9. A sliding module, comprising:
a rail; and
a sliding module positioning device coupled to a slide, the sliding module positioning device further comprising:
a base coupled to the slide;
a positioning pin configured on the base and moveable on the base;
an elastic device coupled to the positioning pin to push the positioning pin toward a positioning hole along a predetermined direction;
an internal pushing member for moving the positioning pin away from the positioning hole; and
an external control member connected with the internal pushing member, wherein the positioning pin is coupled on an inner surface of the external control member to prevent the positioning pin protruding from the external control member when the positioning pin is moved away from the positioning hole.

10. The sliding module of claim 9, wherein the positioning pin further comprises a fixed corner fixed to the positioning pin and coupled to the elastic device to push the positioning pin toward the positioning hole.

11. The sliding module of claim 10, further comprising a retracting bracket fixed to the fixed corner and formed a predetermined angle with the predetermined direction of the positioning pin, and the internal pushing member pushes the retracting bracket to move the positioning pin away from the positioning hole.

12. The sliding module of claim 9, wherein the positioning bracket further comprises an elastic piece, wherein the elastic piece moves the external control member to allow the positioning pin to protrude from the external control member and couple to the positioning hole when the elastic piece is contacted with the external control member and the external control member is drawn out by the elastic piece, and the elastic piece holds the external control member to allow the positioning pin to be in contact with the inner surface of the external control member when the positioning pin is moved away from the positioning hole and drawn back to an inner side of the external control member thereby allowing the sliding module positioning device and the slide being drawn back.

13. The sliding module of claim 12, wherein the external control member further comprises an opening to allow the positioning pin to pass through and couple with the positioning hole.

14. The sliding module of claim 9, wherein the base is fixed to the slide with a supporting bracket.

15. The sliding module of claim 9, wherein the rail is fixed on a server rack.

16. A sliding flat panel display and keyboard module, comprising:
   an L-shaped supporting frame comprising a vertical plane and a horizontal plane;
   a vertical sliding rail configured on the vertical plane;
   a horizontal sliding rail configured on the horizontal plane;
   a sliding flat panel display module coupled to the vertical sliding rail to move along the L-shaped supporting frame;
   a sliding keyboard module coupled to the horizontal sliding rail to move along the L-shaped supporting frame; and
   a sliding module positioning device coupled to a supporting bracket of the sliding flat panel display module, wherein the supporting bracket is movable on the vertical sliding rail, the sliding module positioning device further comprising:
      a base fixed on the supporting bracket;
      a positioning pin configured on the base and moveable on the base;
      an elastic device coupled to the positioning pin to push the positioning pin toward a positioning hole of a positioning bracket on the vertical sliding rail along a predetermined direction;
      an internal pushing member for moving the positioning pin away from the positioning hole; and
      an external control member connected with the internal pushing member, wherein the positioning pin is coupled on an inner surface of the external control member to prevent the positioning pin protruding from the external control member when the positioning pin is moved away from the positioning hole.

17. The sliding flat panel display and keyboard module of claim 16, further comprising a fixed corner and a retracting bracket, the fixed corner fixed to the positioning pin and coupled to the elastic device to push the positioning pin toward the positioning hole, and the retracting bracket fixed to the fixed corner and formed a predetermined angle with the predetermined direction of the positioning pin and the internal pushing member pushes the retracting bracket to move the positioning pin away from the positioning hole.

18. The sliding flat panel display and keyboard module of claim 16, wherein the positioning bracket further comprises an elastic piece, wherein the elastic piece moves the external control member to allow the positioning pin to protrude from the external control member and couple to the positioning hole when the elastic piece is in contact with the external control member and the external control member is drawn out by the elastic piece, and the elastic piece holds the external control member to allow the positioning pin to be in contact with the inner surface of the external control member when the positioning pin is moved away from the positioning hole and drawn back to an inner side of the external control member thereby allowing the sliding module positioning device and the sliding flat panel display module to be drawn back.

19. The sliding flat panel display and keyboard module of claim 16, wherein the L-shaped supporting frame is fixed on a server rack.

20. The sliding flat panel display and keyboard module of claim 16, wherein a width of the horizontal sliding rail is greater than a thickness of the sliding keyboard module.

* * * * *